(12) United States Patent
Kwon et al.

(10) Patent No.: US 8,736,058 B2
(45) Date of Patent: May 27, 2014

(54) LOW-RESISTANCE CONDUCTIVE PATTERN STRUCTURES AND METHODS OF FABRICATING THE SAME

(75) Inventors: Byoung-Ho Kwon, Hwaseong-si (KR); Bo-Un Yoon, Seoul (KR)

(73) Assignee: Samsung Electronics Corporation, Suwon-si (KR)

( * ) Notice: Subject to any disclaimer, the term of this patent is extended or adjusted under 35 U.S.C. 154(b) by 636 days.

(21) Appl. No.: 12/910,356

(22) Filed: Oct. 22, 2010

(65) Prior Publication Data

US 2011/0100693 A1 May 5, 2011

(30) Foreign Application Priority Data

Oct. 29, 2009 (KR) .................. 10-2009-0103634

(51) Int. Cl.
*H01L 23/48* (2006.01)
*H01L 23/52* (2006.01)
*H01L 23/28* (2006.01)
*H01L 29/40* (2006.01)

(52) U.S. Cl.
USPC ........... 257/773; 257/774; 257/775; 257/776; 257/758; 257/759; 257/760

(58) Field of Classification Search
USPC ......... 257/207, 208, 210, 211, 296, 314, 315, 257/758–760, 773–776, E23.142, E23.145, 257/E23.168
See application file for complete search history.

(56) References Cited

U.S. PATENT DOCUMENTS

| 2003/0219967 | A1* | 11/2003 | Tanaka | 438/618 |
| 2005/0191844 | A1* | 9/2005 | Farrar | 438/622 |
| 2008/0157381 | A1* | 7/2008 | Ohayashi et al. | 257/758 |
| 2009/0146313 | A1* | 6/2009 | Terazono et al. | 257/774 |
| 2009/0242955 | A1* | 10/2009 | Olligs | 257/315 |

FOREIGN PATENT DOCUMENTS

| JP | 2006-229212 | 8/2006 |
| KR | 1020010063662 A | 7/2001 |
| KR | 1020050108144 A | 11/2005 |

* cited by examiner

*Primary Examiner* — Steven Loke
*Assistant Examiner* — Juanita B Rhodes
(74) *Attorney, Agent, or Firm* — Myers Bigel Sibley & Sajovec, PA

(57) ABSTRACT

A conductive structure includes a contact plug extending through an insulating layer on a substrate, and first and second conductive lines extending alongside one another on the insulating layer. The first conductive line extends on the contact plug. A connecting line on the insulating layer extends between and electrically connects the first and second conductive lines. Related integrated circuit devices and fabrication methods are also discussed.

22 Claims, 14 Drawing Sheets

FIRST DIRECTION

SECOND DIRECTION

LOW-RESISTANCE CONDUCTIVE PATTERN STRUCTURES AND METHODS OF FABRICATING THE SAME

CLAIM OF PRIORITY

This application claims priority under 35 U.S.C. §119 to Korean Patent Application No. 10-2009-0103634, filed on Oct. 29, 2009, in the Korean Intellectual Property Office (KIPO), the disclosure of which is incorporated by reference herein in its entirety.

BACKGROUND

Example embodiments relate to conductive pattern structures and methods of manufacturing the same. More particularly, example embodiments relate to a conductive pattern structure including a metal material and a method of manufacturing the same.

As semiconductor devices become more highly integrated, wiring of the semiconductor devices may be required to have a smaller or narrower pattern width and/or lower resistance. Therefore, the wiring has been formed using metal materials having low resistance. Such metal wiring may be difficult to form by patterning through a photolithography process. Therefore, a damascene process has been applied for the formation of the metal wiring.

When metal wiring having a relatively wide pattern width is formed by the damascene process, a metal may be deposited to completely fill up an opening formed for forming the wiring. A metal layer formed on a region other than the opening is removed. In order to completely fill up the opening, a deposition thickness of the metal layer may be increased and so the thickness of the metal layer to be removed may also be increased, thereby increasing a manufacturing cost. Frequently, the opening may not be sufficiently and completely filled with the metal layer, which may cause defects.

SUMMARY

Example embodiments provide a conductive pattern structure having reduced process defects and/or a less complex manufacturing process, a method of manufacturing such a conductive pattern structure, and/or an integrated circuit device including such a conductive pattern structure.

According to some example embodiments, a conductive structure includes a contact plug extending through an insulating layer on a substrate, first and second conductive lines extending alongside one another on the insulating layer, and a connecting line on the insulating layer extending between and electrically connecting the first and second conductive lines. The first conductive line extends on the contact plug to provide electrical contact therewith.

In example embodiments, the first and second conductive lines may extend in a first direction substantially parallel to one another, and the connecting line may extend in a second direction substantially perpendicular to the first direction.

In example embodiments, the insulating layer may be a mold pattern. The mold pattern may include first and second trenches extending in a first direction substantially parallel to one another. The first and second trenches may include the first and second conductive lines therein, respectively. A third trench may extend in a second direction and may include the connecting line therein. The third trench may extend through portions of the mold pattern protruding between the first and second trenches.

In example embodiments, a width of the second trench may be less than twice a depth of the second trench. The depth of the second trench may be less than about 2500 angstroms (Å).

In example embodiments, a width of the second conductive line may be less than twice a height of the second conductive line. For example, the width of the second conductive line may be less than about 3500 angstroms (Å). The width of the second conductive line may be greater than or equal to a width of the first conductive line, and wherein a width of the connecting line is less than or equal to the width of the second conductive line.

In example embodiments, the connecting line may be a first connecting line, and a second connecting line may be provided on the insulating layer extending between and electrically connecting the first and second conductive lines. The first and second connecting lines may extend substantially parallel to one another.

In example embodiments, a third conductive line may extend alongside the first conductive line on the insulating layer. In some embodiments, a third connecting line may be provided on the insulating layer extending between and electrically connecting the first and third conductive lines. In other embodiments, the third conductive line may be electrically isolated from the first conductive line.

In example embodiments, the first and second conductive lines and the connecting line may be a same metal layer. For example, the first and second conductive lines and the connecting line may be tungsten.

In example embodiments, a plurality of serially connected transistors may be provided on the substrate. The contact plug may extend through the insulating layer to the substrate to electrically connect the first conductive line with a source/drain region of one of the plurality of serially connected transistors.

According to further example embodiments, an integrated circuit device includes a plurality of transistors on a substrate, an insulating layer on the plurality of transistors, and a contact plug extending through the insulating layer to contact a source/drain region of one of the plurality of transistors. A plurality of conductive lines extend alongside one another on the insulating layer, and one of the plurality of conductive lines extends on the contact plug. A connecting line on the insulating layer extends between and electrically connects the one of the plurality of conductive lines to another of the plurality of conductive lines adjacent thereto.

In example embodiments, a width of one of the plurality of conductive lines may be less than twice a height of the one of the plurality of conductive lines.

In example embodiments, a plurality of connecting lines may extend on the insulating layer and may electrically connect adjacent ones of the plurality of conductive lines to one another.

In example embodiments, the plurality of conductive lines may extend in a first direction substantially parallel to one another, and the plurality of connecting lines may extend in a second direction substantially perpendicular to the first direction.

In example embodiments, the plurality of transistors may be a plurality of serially connected memory cell transistors of a NAND flash memory device. The one of the plurality of conductive lines, the another of the plurality of conductive lines adjacent thereto, and the connecting line may define a common source line of the NAND flash memory device.

According to still further example embodiments, a conductive pattern structure includes a contact plug provided on a substrate. A first conductive line having a first line width is provided to make contact with an upper surface of the contact plug. A second conductive line is arranged in parallel with the first conductive line, has the same height as the first conductive line and has a second line width that is the same as or larger than the first line width. A connecting line is provided to electrically connect side walls of the first and the second conductive lines, so that the first conductive line and the second conductive line function as one conductive line.

In example embodiments, the contact plug, the first conductive line, the second conductive line and the connecting line may be provided within a mold layer pattern. The mold layer pattern may have a contact hole, a first trench connected with the contact hole, a second trench arranged in parallel with the first trench, and a third trench penetrating a portion of the mold layer pattern protruding between the first and the second trenches.

In example embodiments, the first conductive line, the second conductive line and the connecting line may include the same metal material. The first conductive line, the second conductive line and the connecting line may include tungsten.

In example embodiments, the second line width may be larger than twice of a height of the second conductive line.

In example embodiments, the second line width may be smaller than about 3,500 Å.

In example embodiments, a line width of the connecting line may be the same as or smaller than the second line width.

In example embodiments, at least two connecting lines may be provided to two parallel conductive lines in a row.

In example embodiments, a third conductive line may be further provided around the second conductive line in parallel with the second conductive line. Each of the third conductive lines may be provided as one wiring and may have a third width that may be the same as or smaller than the second width.

According to example embodiments, in a method of manufacturing a conductive pattern structure of a semiconductor device, a mold layer pattern is formed on a substrate. The mold layer pattern includes contact holes, a first trench connected with the contact holes, a second trench arranged in parallel with the first trench and a third trench penetrating some portions of the mold layer pattern protruding between the first trench and the second trench. A conductive layer is formed to fill the contact holes, the first trench, the second trench and the third trench. The conductive layer is polished until an upper surface of the mold layer pattern is exposed, to thereby form contact plugs, a first conductive line making contact with an upper surface of the contact plugs and having a first width, a second conductive line having the same height as the first conductive line and a second width that is the same as or larger than the first width and a connecting line for electrically connecting side walls of the first conductive line and the second conductive line in the mold layer pattern. The first conductive line and the second conductive line function as one wiring.

In example embodiments, each width of the contact holes, the first trench and the second trench may be set to a desired deposition thickness so as to fill up inner space portions of the contact holes, the first trench and the second trench when the conductive layer is deposited.

In example embodiments, the desired deposition thickness may be less than about 2,500 Å.

In example embodiments, the conductive layer may include a metal material.

In example embodiments, the conductive layer may include tungsten.

According to example embodiments, a semiconductor device includes cell transistors on a substrate. An insulating interlayer covers the cell transistors. A contact plug penetrates the insulating interlayer. A first conductive line has a first line width and makes contact with an upper surface of the contact plug. A second conductive line is arranged in parallel with the first conductive line, has the same height as the first conductive line and has a second line width that is the same as or larger than the first line width. A connecting line electrically connects side walls of the first conductive line and the second conductive line, so that the first conductive line and the second conductive line function as one conductive line.

In example embodiments, the first conductive line, the second conductive line and the connecting line may function as a common source line in a flash memory device.

A deposition thickness of a conductive layer required for manufacturing a conductive pattern structure may be reduced in accordance with example embodiments. Therefore, a thickness of the conductive layer to be polished also may be reduced. During a manufacturing process of the conductive pattern structure, processing defects and/or manufacturing costs may be reduced. An integrated circuit device including the conductive pattern structure may provide high reliability and/or high yield.

BRIEF DESCRIPTION OF THE DRAWINGS

Example embodiments will be more clearly understood from the following detailed description taken in conjunction with the accompanying drawings.

FIG. 1 is a plan view illustrating a conductive pattern structure in accordance with a first example embodiment.

FIG. 2 is a perspective view illustrating a conductive pattern structure illustrated in FIG. 1.

FIG. 3 is another perspective view illustrating a conductive pattern structure illustrated in FIG. 1.

FIG. 4 is a flow chart for explaining a method of manufacturing a conductive pattern structure in FIG. 1.

FIGS. 5 and 6 are perspective views for explaining a method of manufacturing a conductive pattern structure in FIGS. 2 and 3.

FIG. 7 is a common conductive line for comparison with the first example embodiment.

FIG. 8 is a cross-sectional view for explaining a forming process of the conductive line in FIG. 7.

FIG. 9 is a plan view for illustrating a conductive pattern structure in accordance with a second example embodiment.

FIGS. 10 to 12 are cross-sectional views for explaining a method of manufacturing a conductive pattern structure in FIG. 9.

FIG. 13 is a plan view for illustrating a conductive pattern structure in accordance with a third example embodiment.

FIG. 14 is a perspective view for illustrating a conductive pattern structure illustrated in FIG. 13.

FIGS. 15 to 17 are cross-sectional views for explaining a method of manufacturing a conductive pattern structure in FIGS. 13 & 14.

FIG. 18 is a plan view for illustrating a conductive pattern structure in accordance with a fourth example embodiment.

FIG. 19 is a plan view for illustrating a conductive pattern structure in accordance with a fifth example embodiment.

FIG. 20 is a NAND flash memory device in accordance with a sixth example embodiment.

FIG. 21 is a circuit diagram of a NAND flash memory device in FIG. 20.

FIGS. 22 to 24 are cross-sectional views for explaining a method of manufacturing a NAND flash memory device in FIG. 20.

FIG. 25 is a block diagram for illustrating a system including a NAND flash memory device in FIG. 20.

Figure 1:
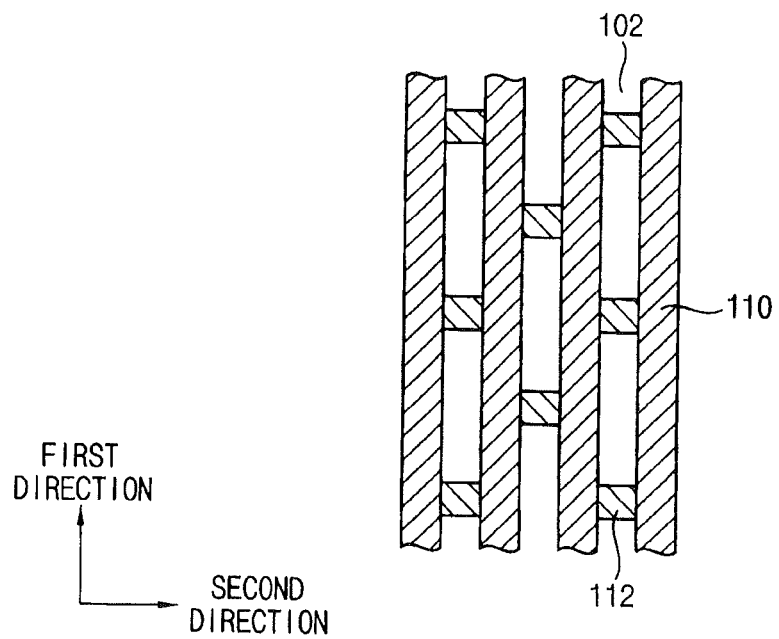
FIGS. 1 to 25 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example Embodiment 1

Figure 2:
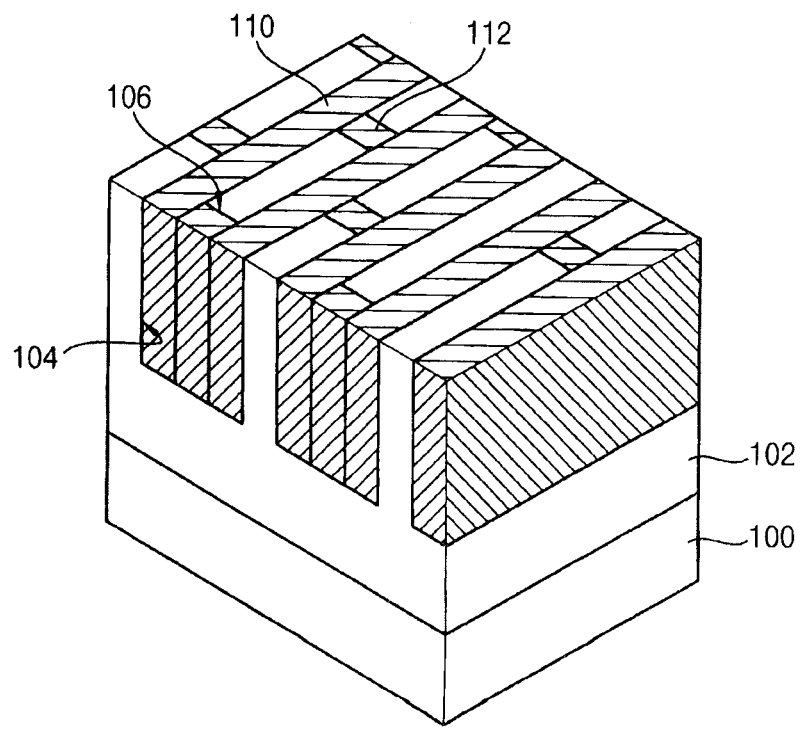
Figure 3:
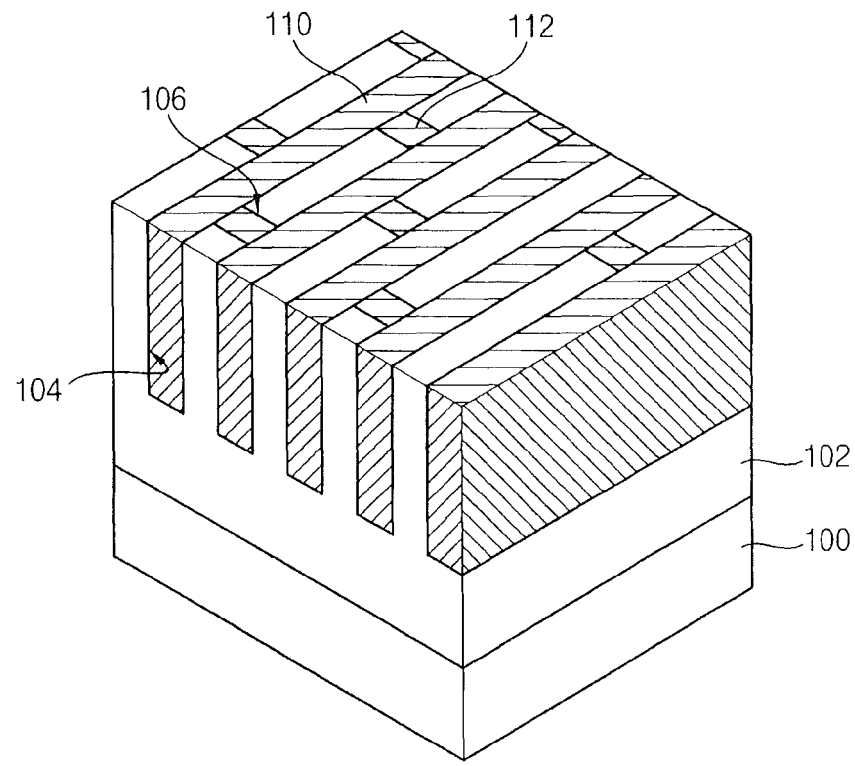

FIG. 1 is a plan view illustrating a conductive pattern structure in accordance with an example embodiment. FIG. 2 is a perspective view illustrating a conductive pattern structure illustrated in FIG. 1. FIG. 3 is another perspective view illustrating a conductive pattern structure illustrated in FIG. 1.

A connecting line is shown at the cross-section in the perspective view of FIG. 2, however, the connecting line is not shown at the cross-section in the perspective view of FIG. 3.

Referring to FIGS. 1 to 3, a conductive pattern structure 116 may include a mold layer 102 formed using an insulating material on a substrate 100. A plurality of first trenches 104 may be formed in parallel to each other at the mold layer 102. A plurality of second trenches 106 penetrating some portions of the side walls of the mold layer 102 protruding between plurality of the first trenches 104 may be formed. Each of the second trenches 106 may penetrate into some portions of the side walls of the mold layer 102 that protrudes between two neighboring first trenches 104.

A plurality of narrow or minute conductive lines 110 may be formed in the first trenches 104, which are spaced apart from each other and arranged in parallel to each other. The minute conductive lines 110 may extend in a first direction. Particularly, a metal included in the minute conductive lines 110 may have a property to be deposited along a pattern profile. The metal forming the minute conductive lines 110 may be formed using tungsten. Alternatively, the metal may include copper, aluminum, etc.

In the second trenches 106, connecting lines 112 electrically connecting the minute conductive lines 110 may be formed. All of the minute conductive lines 110 arranged in parallel to each other may be electrically connected by the connecting lines 112. The connecting lines 112 may be formed by using the same material as the minute conducting lines 110.

One of the connecting lines 112 may connect the side walls of two neighboring minute conductive lines 110 with each other. The minute conductive lines 110 that are electrically connected by the connecting lines 112 may function as one conductive line having a wide pattern width.

The connecting lines 112 may extend along a second direction that is substantially perpendicular to the first direction. A plurality of connecting lines 112 may be provided between two neighboring minute conductive lines 110 along the first direction. Therefore, the two neighboring minute conductive lines 110 and the connecting lines 112 for connecting the minute conductive lines 110 may form a trapezoid or rectangular shape as illustrated in FIGS. 1 to 3.

When the plurality of the connecting lines 112 are provided in parallel along the first direction between two neighboring minute conductive lines 110, an electrically connected state of the two minute conductive lines 110 may be maintained even though a portion of the connecting lines 112 may be disconnected, because remaining connecting lines 112 electrically connect the two minute conductive lines 110. Therefore, operating defects may rarely be generated for the conductive pattern structure 116 even though process defects may be generated during the formation of the connecting lines 112.

Each of the minute conductive lines 110 and the connecting lines 112 may have a narrower line width than a desired or critical line width. When the desired or critical line width is larger than twice of the height of the minute conductive lines 110, a deposition thickness of a conductive layer for forming the minute conductive lines 110 and the connecting lines 112 may largely increase. When the desired or critical line width is larger than about 3,500 Å, the thickness of the conductive layer for forming the minute conductive lines 110 and the connecting lines 112 may be about 2,000 Å or over. Accordingly, a manufacturing cost for the deposition and polishing of the conductive layer may be increased. Thus, the desired or critical line width may be less than twice of the height of each of the minute conductive lines 110, thereby defining a desired aspect ratio for the trenches in which the minute conductive lines 110 are formed. The desired or critical line width may be narrower than about 3,500 Å in some embodiments.

However, the desired or critical line width of the minute conductive lines 110 may be dependent on depositing characteristic and polishing characteristic of a metal material for forming the minute conductive lines 110.

The conductive pattern structure 116 having a desired resistance may be obtained by changing the number of the minute conductive lines 110 electrically connected to each other by the connecting lines 112.

Figure 4:
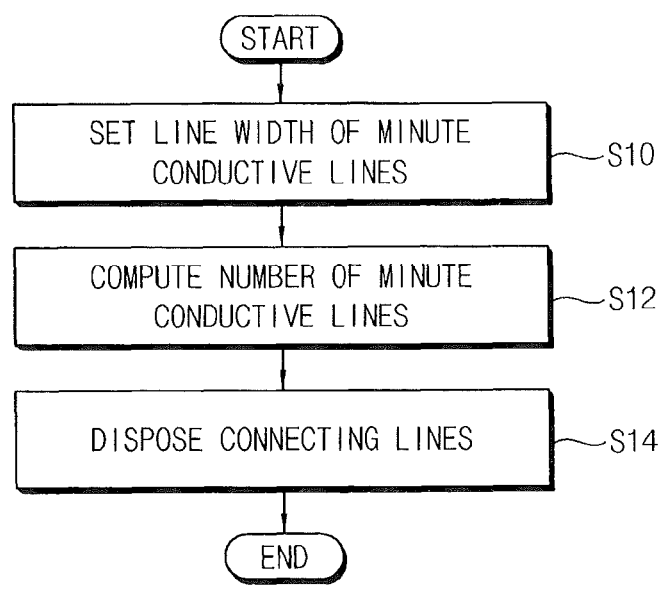

FIG. 4 is a flow chart for explaining a method of manufacturing a conductive pattern structure in FIG. 1.

First, a desired or critical line width of the minute conductive lines 110 may be set in order to form the conductive pattern structure 116 in accordance with Example Embodiment 1 (step S10).

The desired or critical line width may be set so that conductive layers may bury trenches without forming voids and the conductive layer may be polished in a short time. The desired or critical width of the minute conductive lines 110 may dependent on the depositing characteristic and the polishing characteristic of the metal material for forming the minute conductive lines 110.

As described above, the critical or desired line width of the minute conductive lines 110 may be less than twice the height of each minute conductive line 110. More preferred critical line widths may be smaller than about 3,500 Å.

As the line width of the minute conductive lines 110 increases, the deposition thickness of the conductive layer for forming the minute conductive lines 110 may be increased and the polishing thickness of the conductive layer also may be increased. Therefore, the reduction of the line width of the minute conductive lines 110 may be desirable. However, when the line width of the minute conductive lines 110 decreases excessively, the trench forming process and the conductive layer depositing process for forming the minute conductive lines 110 may not be advantageous and the number of the minute conductive lines 110 may be decreased.

When the line width of the minute conductive lines 110 is less than twice of the height of each minute conductive line 110, a conductive material deposited on the side walls of one trench may meet within the trench to fill up the inner portion of the first trenches 104. Therefore, minute conductive lines 110 having a line width of twice of the deposited thickness of the conductive layer or less, preferably from 1.5 times to twice of the deposited thickness of the conductive layer may be formed. Particularly, when the minute conductive lines 110 are formed by depositing the conductive layer to a thickness of about 2,000 Å, the line width of the minute conductive lines 110 may be about 3,500 Å.

The line width of the minute conductive lines 110 may also be smaller than the desired or critical line width in some embodiments.

After the critical or desired line width of the minute conductive lines 110 is determined, the number of the minute conductive lines 110 required for manufacturing the conductive pattern structure having a desired resistance may be computed (step S12). In particular, the desired resistance for the conductive lines 110 may be divided by the desired line width to compute the number of conductive lines 110. For example, when a line width of a conductive line representing the desired resistance is about 10,000 Å, about three minute conductive lines having a line width of about 3,500 Å may be disposed. Alternatively, about five minute conductive lines having a line width of about 2,000 Å may be disposed.

Further, a plurality of connecting lines for electrically connecting the minute conductive lines 110 may be disposed (step S14).

As described above, the conductive pattern structure 116 having a desired resistance as illustrated in FIG. 1 may be manufactured by reducing the deposition thickness of the metal and reducing the polishing thickness of the metal. Further, problems during the formation of a conductive line having a wide line width (for example, defects generated due to an insufficient deposition of a metal and/or defects generated due to excessive polishing or insufficient polishing of the metal), may be reduced and/or eliminated.

Figure 5:
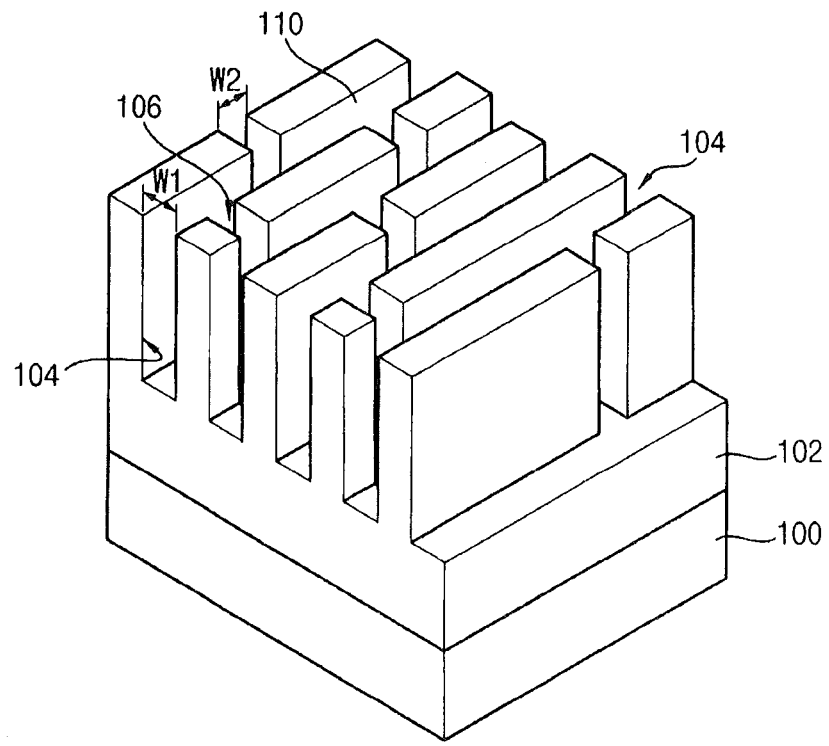
Figure 6:
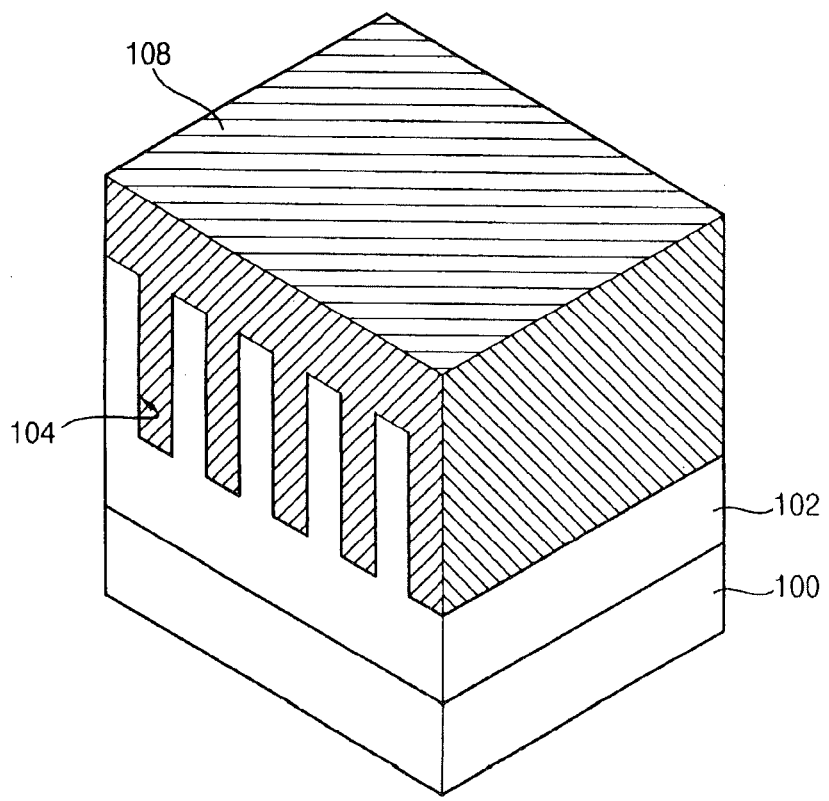

FIGS. 5 and 6 are perspective views for explaining a method of manufacturing a conductive pattern structure in FIGS. 2 and 3.

Referring to FIG. 5, the mold layer 102 may be formed on the substrate 100. On the substrate 100, devices (not shown) such as transistors may be formed. The mold layer 102 may be formed using an insulating material including silicon oxide. The mold layer 102 may be formed to have a substantially planar upper surface.

A portion of the mold layer 102 may be etched by a photolithography process to form the first trenches 104 having a shape extending in the first direction and the second trenches 106 penetrating some protruding portions of the side walls between the neighboring first trenches 104. The first and the second trenches 104 and 106 may be formed by performing a photo process once and an etching process once. Alternatively, the first and the second trenches 104 and 106 may be formed through a first photo process for forming the first trenches 104, a second photo process for forming the second trenches 106 and then by performing an etching process once.

The first trenches 104 may be disposed substantially parallel to each other. In a following process, minute conductive lines 110 may be formed in the first trenches 104. Therefore, the first trenches 104 may have the same line width as that of the designed minute conductive lines 110. The number of the first trenches 104 also may be the same as the number of the desired minute conductive lines 110.

The second trenches 106 may penetrate some portions of the side walls of the mold layer 102 between two neighboring first trenches 104. The second trenches 106 may be disposed along the second direction substantially perpendicular to the first direction. The second trenches 106 may not be disposed along one row but deviated from each other. A plurality of the second trenches 106 may be provided to the neighboring first trenches 104. The width W2 of the second trenches 106 along the first direction may be the same as the width W1 of the first trenches 104 along the second direction or may be smaller than the width W1 of the first trenches 104.

Each of the widths W1 and W2 of the first and the second trenches 104 and 106 may be selected or set so that the inner portions of the first and the second trenches 104 and 106 may be filled with the conductive layer while performing a subsequent process of depositing the conductive layer to a critical or desired deposition thickness. The desired or critical deposition thickness may be determined by considering the deposition characteristic and the polishing characteristic of the conductive layer and may be about 2,500 Å or less. When the conductive layer is deposited to a desired or critical deposition thickness of about 2,500 Å, the width of the first and the second trenches 104 and 106 may be smaller than about 3,500 Å so as to fill up the inner portions of the first and the second trenches 104 and 106 completely.

The width of the first trenches 104 may be less than twice of the depth of the first trenches 104.

Referring to FIG. 6, a conductive layer 108 filling up the inner portions of the first and the second trenches 104 and 106 may be formed. The conductive layer 108 may include a metal. The conductive layer 108 may be formed using a metal having a property of being deposited along a pattern profile. For example, the conductive layer 108 may include tungsten. Alternatively, the conductive layer 108 may include aluminum, copper, etc.

In particular, a barrier metal layer (not shown) may be formed along the side walls of the first and the second trenches 104 and 106 and a metal layer may be formed on the barrier metal layer to fill up the inner portions of the first and the second trenches 104 and 106.

When the conductive layer 108 is formed using a material having a conformal depositing characteristic such as tungsten, the required thickness of the conductive layer 108 for filling the inner portion of the first trenches 104 may be changed according to the width of the first trenches 104.

For example, when the width of the first trenches 104 is larger than twice a depth of the first trenches 104, the deposition thickness of the conductive layer 108 may have a height similar to that of the first trenches 104 to fill up the inner portion of the first trenches 104. In this case, the deposition thickness of the conductive layer 108 may be increased.

When the width of the first trenches 104 is smaller than twice the depth of the first trenches 104, the conductive layer 108 formed on both of the side walls of one of the first trenches 104 may meet to fill up the inner portion of the first trenches 104. Accordingly, the deposition thickness of the conductive layer 108 may be ½ or larger than the width of the first trenches 104 to completely fill up the first trenches 104. In this case, the deposition thickness of the conductive layer 108 may be reduced. Therefore, the width of the first trenches 104 may be less than twice the depth of the first trenches 104.

As described above, the width of the first trenches 104 may be the same as the line width of the desired minute conductive lines. Accordingly, the inner portions of the first and the second trenches 104 and 106 may be filled up by depositing the conductive layer 108 to a thickness of ½ or more of the width of the first trenches 104. The thickness of the conductive layer 108 deposited on the upper surface of the mold layer 102 also may be reduced as the deposition thickness of the conductive layer 108 is reduced.

Referring to FIGS. 2 and 3 again, the conductive layer 108 deposited on the upper surface of the mold layer 102 may be polished to form the minute conductive lines 110 in the inner portion of the first trenches 104 and the connecting lines 112 in the inner portion of the second trenches 106. The connecting lines 112 may electrically connect all minute conductive lines 110 disposed in parallel to each other.

The minute conductive lines 110 electronically connected by the connecting lines 112 may have the same resistance as a conductive line having a wider line width and may function as one conductive line (e.g., a single conductive line).

Figure 7:
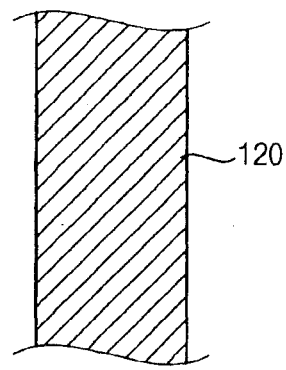

FIG. 7 is a common conductive line illustrated for comparison with the Example Embodiment 1.

Figure 8:
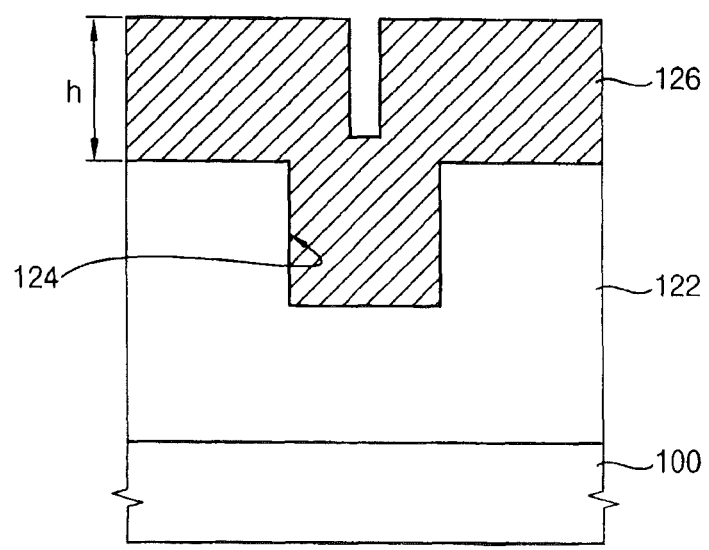

FIG. 8 is a cross-sectional view for explaining a forming process of the conductive line in FIG. 7.

Referring to FIG. 7, a conductive line 120 may have the same resistance as that of the conductive pattern structure 116 in accordance with the first example embodiment illustrated in FIG. 1.

Referring to FIG. 8, when the conductive line 120 may be formed as one pattern having a wider line width, a trench 124 having a wide width may be required to be formed in a mold layer 122.

When the line width of the trench 124 increases, a thickness "h" of a conductive layer 126 deposited to fill the inner portion of the trench 124 with the conductive layer 126 may increase. In this case, the inner portion of the trench 124 may be insufficiently filled with the conductive layer 126 so that voids or defects may be formed. Further, the thickness "h" of the conductive layer 126 formed on the mold layer 122 also may increase so that a thickness "h" of the conductive layer 126 to be polished may increase.

However, the conductive pattern structure 116 in accordance with some embodiments may include the minute conductive lines 110 and the connecting lines 112 in accordance with this Example Embodiment. The deposition thickness and the polishing thickness may be reduced while accomplishing a similar electrical function as the conductive pattern structure including one conductive line having a wide line width.

Example Embodiment 2

Figure 9:
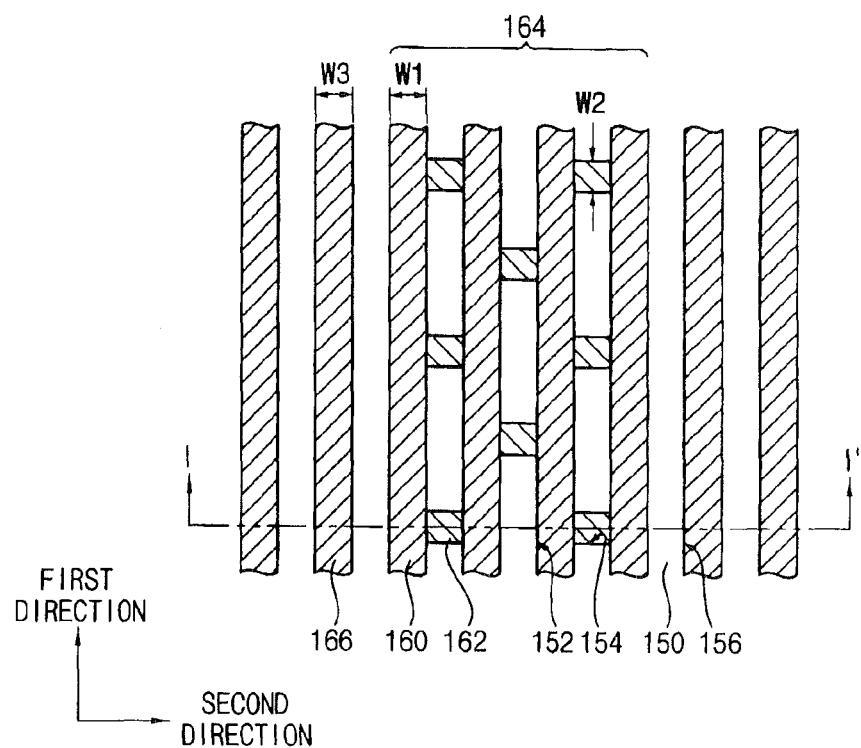

FIG. 9 is a plan view for illustrating a conductive pattern structure in accordance with Example Embodiment 2.

Referring to FIG. 9, a mold layer 150 of an insulating material may be formed on a substrate.

A plurality of first trenches 152 having a first width W1 may be formed substantially parallel to each other and along a first direction at the mold layer 150. Second trenches 154 penetrating some portions of side walls of the mold layer 150 between the first trenches 152 may be formed. Each of the second trenches 154 may penetrate the protruding mold layer 150 between two neighboring first trenches 152. A second width W2 of the second trenches 154 along a second direction may be the same as or smaller than the first width W1. The first and the second trenches 152 and 154 may have the same depth.

One or more third trenches 156 having a third width and disposed in parallel to each other may be formed in the mold layer 150.

The first, second and third widths W1, W2 and W3 may be smaller than a desired or critical line width determined by considering the depositing characteristics and/or the polishing characteristics of a metal material forming the conductive lines. The desired or critical line width may be less than twice of the depth of the first trenches 152. The desired or critical line width may be smaller than about 3,500 Å. The first, second and third widths W1, W2 and W3 may be the same or different from each other.

Minute conductive lines 160 may be provided in the first trenches 152. Connecting lines 162 may be provided in the second trenches 154 for connecting the minute conductive lines 160. A group of the minute conductive lines 160 electrically connected by the connecting lines 162 may electrically function as one conductive line 164. The minute conductive lines 160 and the connecting lines 162 may form a first conductive line 164 having a low resistance. The first conductive line 164 may have the same structure as the conductive pattern structure 116 illustrated in Example Embodiment 1.

Second conductive lines 166 may be disposed separately and substantially parallel to each other in the third trenches 156. The connecting lines may not be provided to the second conductive lines 166 and each one of the second conductive lines 166 may function as a separate conductive line. Therefore, the second conductive lines 166 may have higher resistances than the first conductive line 164 connected by the minute conductive lines 160 with one another.

The first conductive line 164 and the second conductive lines 166 may be formed using the same material.

As described above, the line widths of the minute conductive lines, the connecting lines and the second conductive lines may be smaller than the desired or critical line width.

Although not shown in figures, additional conductive lines having various resistances may be provided to constitute a circuit. Each of the conductive lines having different resistances may include electrically connected minute conductive patterns having a line width smaller than the desired or critical line width. Accordingly, a line width of all the conductive lines constituting the circuit may be smaller than the desired or critical line width.

Figure 10:
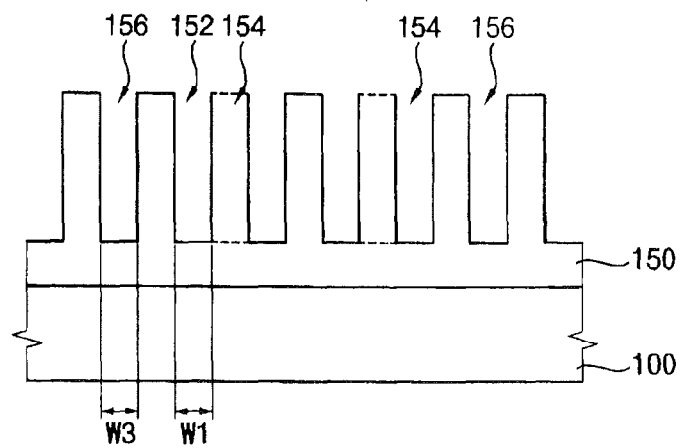
Figure 11:
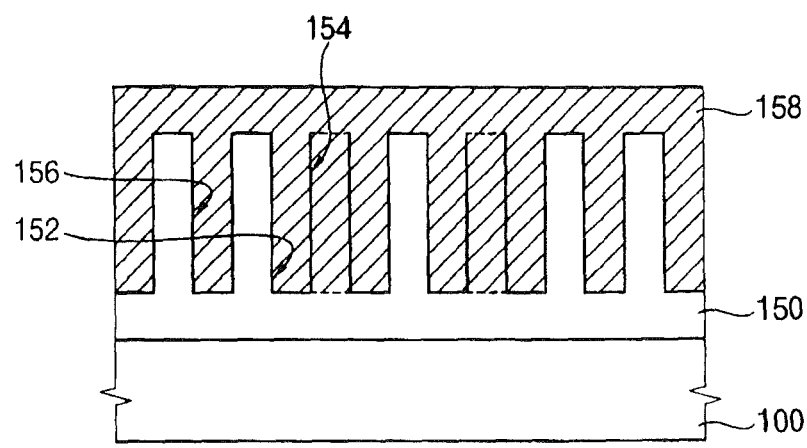
Figure 12:
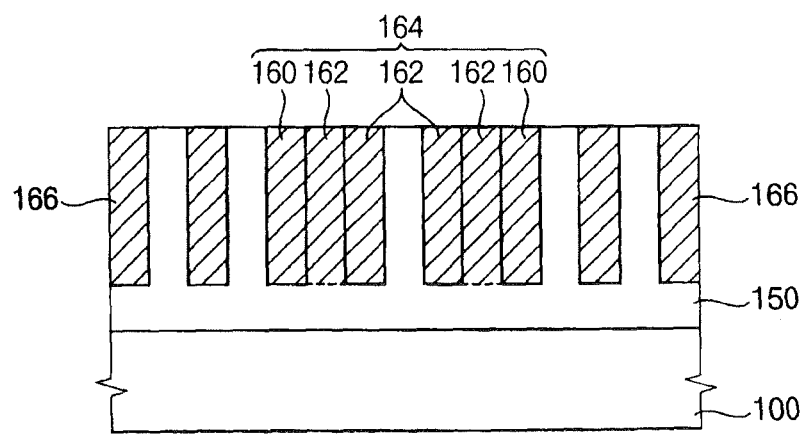

FIGS. 10 to 12 are cross-sectional views for explaining a method of manufacturing a conductive pattern structure in FIG. 9.

The cross-sections in FIGS. 10 to 12 are taken along the line I-I' in FIG. 9.

Referring to FIG. 10, the mold layer 150 may be formed on the substrate 100. On the substrate 100, devices constituting a semiconductor device such as transistors may be formed. The mold layer 150 may be formed using a dielectric material such as silicon oxide. The mold layer 150 may be formed to have a substantially planar upper surface.

A portion of the mold layer 150 may be etched through a photolithography process to form the first trenches 152 having a linear shape and the first width W1 and the third trenches 156 having a linear shape and the third width W3. As shown in FIG. 9, the first and the third widths W1 and W3 may be the same. Alternatively, the first and the third widths W1 and W3 may be different from each other.

The first and the third widths W1 and W3 may be smaller than the desired or critical line width determined by the depositing characteristics and/or the polishing characteristics of a metal material forming the conductive lines. The difference between the first width W1 and the third width W3 may be relatively small because the first and the third widths W1 and W3 may be less than the desired or critical line width.

The first trenches 152 may have a shape extending in the first direction and may be formed adjacent and substantially parallel to each other. Also, the third trenches 156 may have a shape extending in the first direction and arranged substantially parallel to each other.

The second trenches 154 penetrating some portions of the side walls of the mold layer 150 protruding between the first trenches 152 and having the second width W2 may be formed. The second trenches 154 may be formed through the same photolithography process for forming the first and the third trenches 152 and 156. Alternatively, the second trenches 154 may be formed through performing a separate photolithography process.

Referring to FIG. 11, a conductive layer 158 filling up the inner portions of the first, the second and the third trenches 152, 154 and 156 may be formed. The conductive layer 158 may include a metal. The conductive layer 158 may be formed using a metal having a property of being deposited along the pattern profile. For example, the conductive layer 158 may be formed using tungsten. Alternatively, the conductive layer 158 may be formed using one of aluminum, copper, etc.

In particular, a barrier metal layer may be formed along the side walls of the first, second and third trenches 152, 154 and 156. On the barrier metal layer, a metal layer may be formed to fill up the first, second and third trenches 152, 154 and 156.

Referring to FIG. 12, the conductive layer 158 deposited on the upper surface of the mold layer 150 may be polished to form the first conductive line 164 including the minute conductive lines 160 and the connecting lines 162 in the first and second trenches 152 and 154. The second conductive lines 166 may be formed in the third trenches 156.

According to the second example embodiment, the first conductive line 164 including a plurality of minute conductive lines 160 and having a low resistance, the second conductive lines 166 having a wider width and having a relatively higher resistance may be formed. In addition, defects generated during forming the first and the second conductive lines 166 and 164 may be reduced.

Example Embodiment 3

Figure 13:
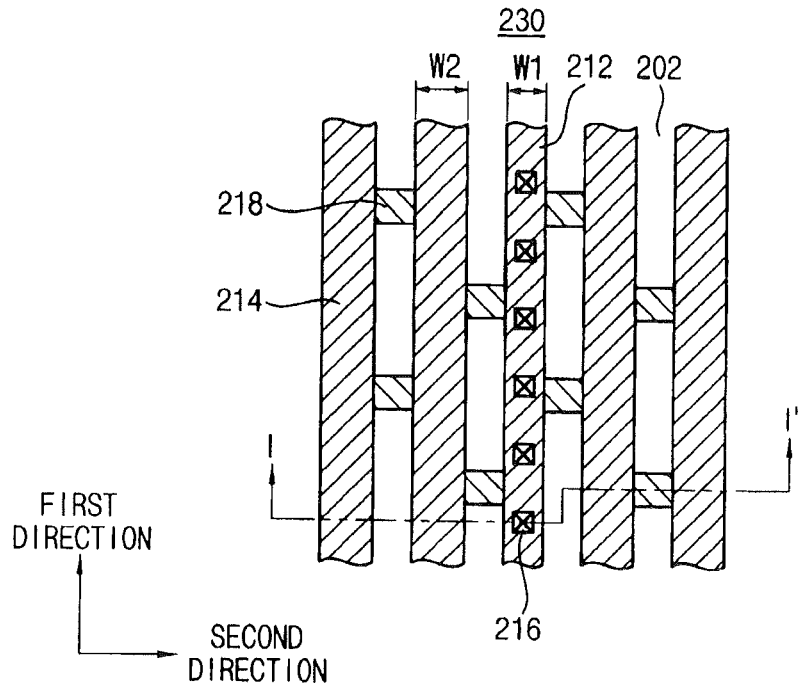

FIG. 13 is a plan view for illustrating a conductive pattern structure in accordance with Example Embodiment 3. FIG.

14 is a perspective view for illustrating a conductive pattern structure illustrated in FIG. 13.

Figure 14:
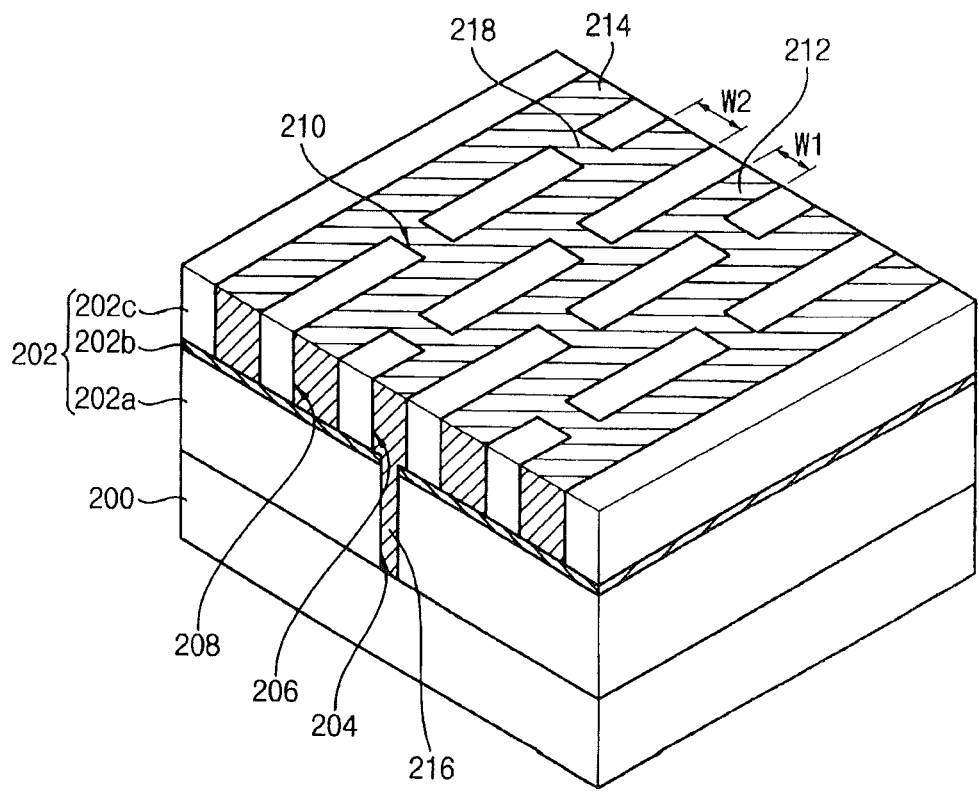

Referring to FIGS. 13 and 14, a mold layer 202 of an insulating material may be formed on a substrate 200. The mold layer 202 may have a laminated structure of a first silicon oxide layer 202a, an etch stop layer 202b and a second silicon oxide layer 202c. In the mold layer 202, contact holes 204 and trenches 206, 208 and 210 may be formed.

In particular, the contact holes 204 exposing a portion of the surface of the substrate 200 may be formed through the mold layer 202. The contact holes 204 may be disposed along a first direction.

A first trench 206 connected with the contact holes 204 and extending along the first direction may be formed in portions of the mold layer 202 including the contact holes 204 therein. The first trench 206 may have a first width W1.

A plurality of second trenches 208 having the same height as the first trench 206 may be formed in parallel with the first trench 206. The second trenches 208 may have a second width W2 that may be the same as or wider than the first width W1. The second width W2 may be larger than the first width W1 in accordance with Example Embodiment 3. When the second width W2 is larger than the first width W1, the number of second minute conductive lines 214 included in a conductive pattern structure 230 may be reduced.

Furthermore, third trenches 210 penetrating portions of the side walls of the mold layer 202 protruding between the first and the second trenches 206 and 208 may be provided. The plurality of third trenches 210 may be provided along the first direction in parallel to each other.

The first and second widths W1 and W2 may be smaller than a desired or critical line width determined by depositing characteristics and/or a polishing characteristics of a metal material forming the conductive lines. The desired or critical line width may be smaller than twice of a depth of the second trenches 208. The desired or critical line width may be smaller than about 3,500 Å.

Contact plugs 216 may be formed in the contact holes 204. First minute conductive line 212 having the first line width W1 and making an electrical contact with the upper surface of the contact holes 204 may be formed in the first trench 206. Second minute conductive lines 214 having the second line width W2 may be formed. The first and the second minute conductive lines 212 and 214 may have the same height.

Connecting lines 218 for electrically connecting the first and second minute conductive lines 212 and 214 may be formed. An electrically connected group of the first and second minute conductive lines 212 and 214 by the connecting lines 218 may function as one conductive line. The conductive line may be electrically connected with the underlying contact plugs 216.

The first and the second minute conductive lines 212 and 214 and the connecting lines 218 may be formed by using the same conductive material.

Figure 15:
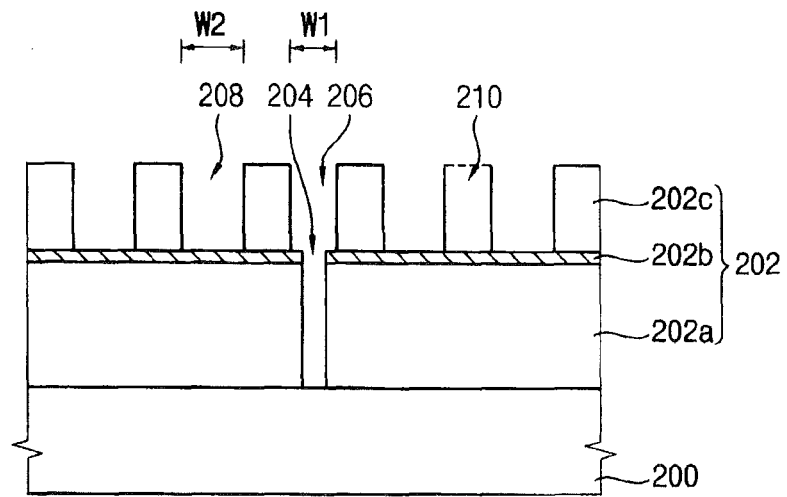
Figure 16:
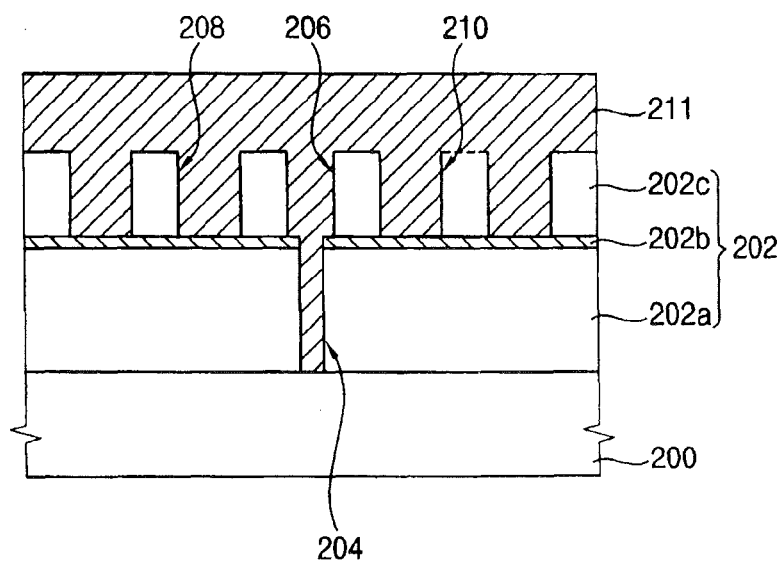
Figure 17:
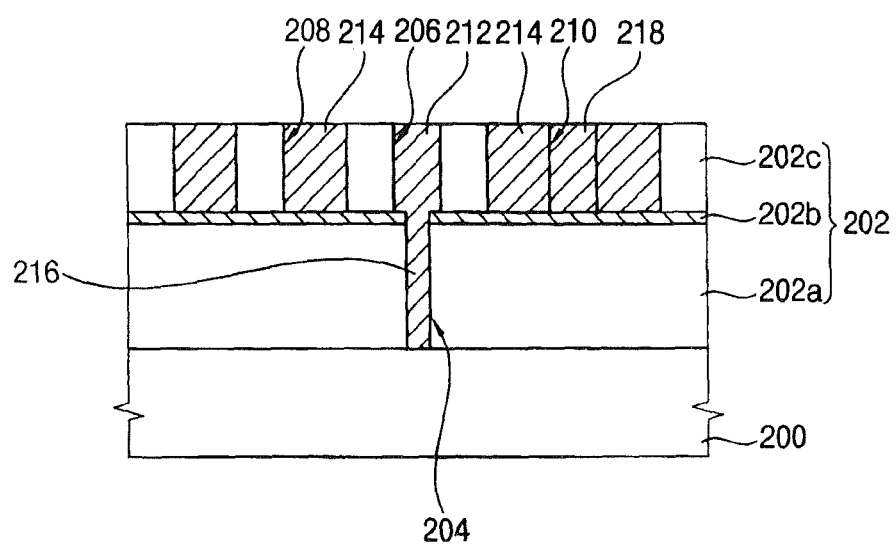

FIGS. 15 to 17 are cross-sectional views illustrated for explaining a method of manufacturing a conductive pattern structure in FIGS. 13 & 14.

The cross-sections of FIGS. 15 to 17 may be obtained by cutting along the line I-I' in FIG. 13.

Referring to FIG. 15, the mold layer 202 including an insulating material may be formed on the substrate 200. Devices for constituting a semiconductor device such as transistors may be formed on the substrate 200. The mold layer 202 may be formed by sequentially depositing the first silicon oxide layer 202a, the etch stop layer 202b and the second silicon oxide layer 202c. The mold layer 202 may have a substantially planar upper surface.

A portion of the mold layer 202 may be etched by a photolithography process to form the contact holes 204 exposing a portion of the surface of the substrate 200. Otherwise, the contact holes 204 may expose underlying a portion of conductive patterns.

The first trench 206 having a linear shape to make contact with or provide a connection to the upper portion of the contact holes 204 and having the first width W1 may be formed by the photolithography process. The second trenches 208 having the second width W2, which may be the same as or larger than the first width W1 may be formed adjacent to the first trench 206. The third trenches 210 penetrating portions of the side walls of the mold layer 202 protruding between the first and second trenches 206 and 208 may be formed.

The procedure for forming the contact holes 204 and the procedure for forming the trenches 206, 208 and 210 may be exchanged or performed in a different order. For example, the first, second and third trenches 206, 208 and 210 may be formed before forming the contact holes 204 in the first trench 206.

The first and second widths W1 and W2 may be smaller than the desired or critical line width determined by a depositing characteristic and a polishing characteristic of a metal material forming the conductive lines.

Referring to FIG. 16, a conductive layer 211 filling up the first, second and third trenches 206, 208 and 210 and the contact holes 204 may be formed. The conductive layer 211 may include a metal. The conductive layer 211 may include a metal having a characteristic of being deposited along a pattern profile. For example, the conductive layer 211 may include tungsten. The conductive layer 211 may include one of aluminum, copper, etc. When the conductive layer 211 is deposited to a thickness smaller than the desired or critical deposition thickness, the inner portion of the first, second and third trenches 206, 208 and 210 and the contact holes 204 may be filled with the conductive layer. The desired or critical deposition thickness may be smaller than about 2,500 Å.

The contact holes 204 connected through the lower portion of the first trench 206 may be formed as illustrated in FIG. 16. Through the depositing process of the metal, the conductive layer 211 may fill up the first trench 206 along with the contact holes 204. When the first trench 206 and the second trenches 208 have the same width, a thickness of the conductive layer 211 required for filling up the inner portion of the first trench 206 may be larger than a thickness of the conductive layer 211 required for filling up the inner portion of the second trenches 208.

When a width of the second trenches 208 is larger than a width of the first trench 206, and the conductive layer 211 is deposited to fill up the inner portion of the first trench 206, the inner portion of the second trenches 208 also may be filled with the conductive layer 211. Therefore, the second width W2 of the second trenches 208 may be larger than the first width W1 of the first trench 206 or may be the same as the first width W1.

Referring to FIG. 17, the conductive layer 211 deposited on the upper surface of the mold layer 202 may be polished to form the first minute conductive line 212, the second minute conductive lines 214, the contact plugs 216 and the connecting lines 218, respectively. The first minute conductive line 212, the second minute conductive lines 214 and the connecting lines 218 may electrically function as one conductive line. The contact plugs 216 may be electrically connected with the first and second minute conductive lines 212 and 214 and the connecting lines 218.

Since a thickness to be deposited for forming the conductive layer 211 may be reduced, a thickness of the conductive layer to be polished may become thin. Therefore, the polishing process of the conductive layer 211 may be easier and the time and cost required for the polishing process may be reduced.

In accordance with the third example embodiment, a conductive pattern structure having a low resistance and electrically connected with the surface of the substrate 200 may be formed. The processing costs and the generation of the processing defects during formation of the conductive pattern structure may be reduced.

Example Embodiment 4

Figure 18:
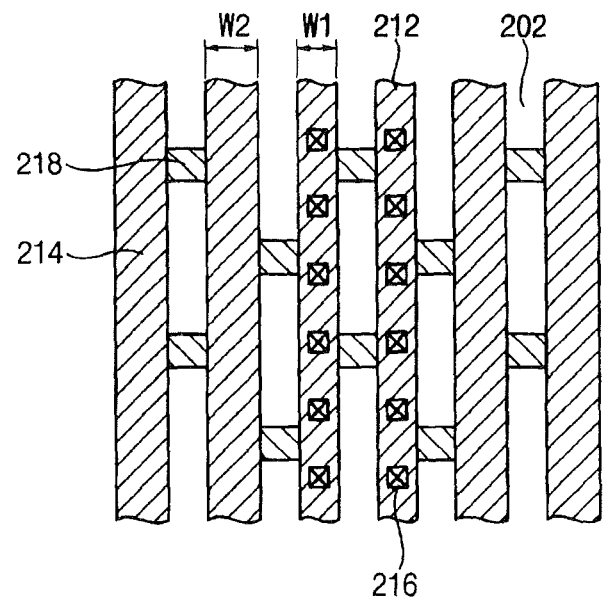

FIG. 18 is a plan view illustrating a conductive pattern structure in accordance with Example Embodiment 4.

Referring to FIG. 18, a conductive pattern structure in accordance with Example Embodiment 4 may include the same elements of the conductive pattern structure described in Example Embodiment 3 except that two first minute conductive lines 212 may be connected with the contact plugs 216 along the first direction.

When the first minute conductive lines 212 are aligned in two rows along the first direction, a width of the contact plugs 216 may not be increased even though a horizontal area of the first minute conductive lines 212 at the contacting portion with the contact plugs 216 may be increased. According to the horizontal area at the contacting portion with the contact plugs 216, the number of the rows of the contact plugs 216 and the first minute conductive lines 212 may be increased or controlled appropriately.

The conductive pattern structure in FIG. 18 may be formed through performing a similar procedure described referring to FIGS. 15 to 17, except for additionally forming at least one additional first trench and the contact holes in the mold layer.

Example Embodiment 5

Figure 19:
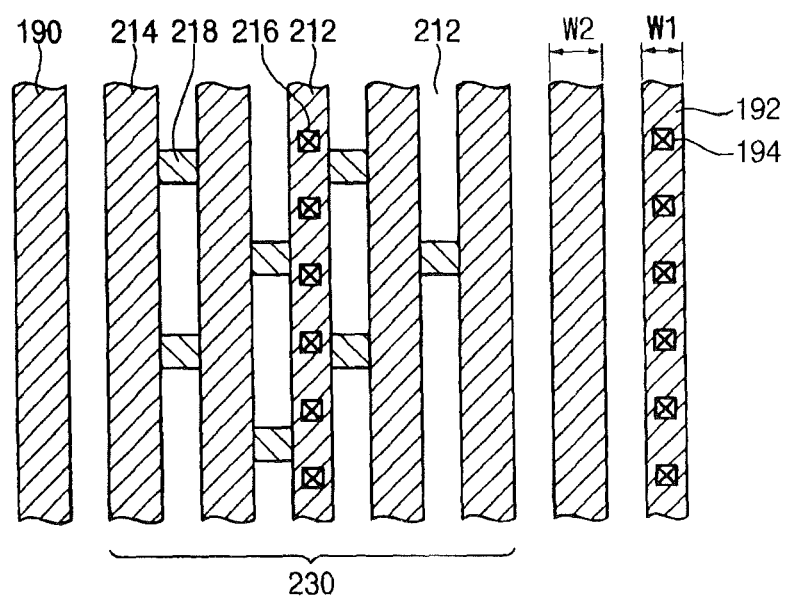

FIG. 19 is a plan view for illustrating a conductive pattern structure in accordance with Example Embodiment 5.

Referring to FIG. 19, a conductive pattern structure in accordance with the fifth example embodiment may include a first conductive line 230, which may have the same structure as the conductive pattern structure in accordance with Example Embodiment 3.

The conductive pattern structure according to this Example Embodiment may include a second conductive lines 190 including one or more conductive lines without any connecting lines coupled thereto. The second conductive line 190 may have a line width smaller than a desired or critical line width.

A third conductive line 192 without any connecting lines may be formed. The line width of the third conductive line 192 may be the same as or smaller than the line width of the second conductive line 190. Second contact plugs 194 making contact with the substrate may be provided under the third conductive line 192.

In order to form the conductive pattern structure illustrated in FIG. 19, a similar procedure described referring to FIGS. 15 to 17 may be performed except for forming the first, second and third trenches and the first contact holes along with fourth and fifth trenches and second contact holes in the mold layer.

In the fourth and the fifth trenches, the second conductive line 190 and the third conductive line 192 may be formed. In the second contact holes, the second contact plugs 194 may be formed. The fourth and fifth trenches may be formed while implementing the photolithography process for forming the first, the second and the third trenches. The second contact holes may be formed while implementing the photolithography process for forming the first contact holes below the first trenches.

Example Embodiment 6

Figure 20:
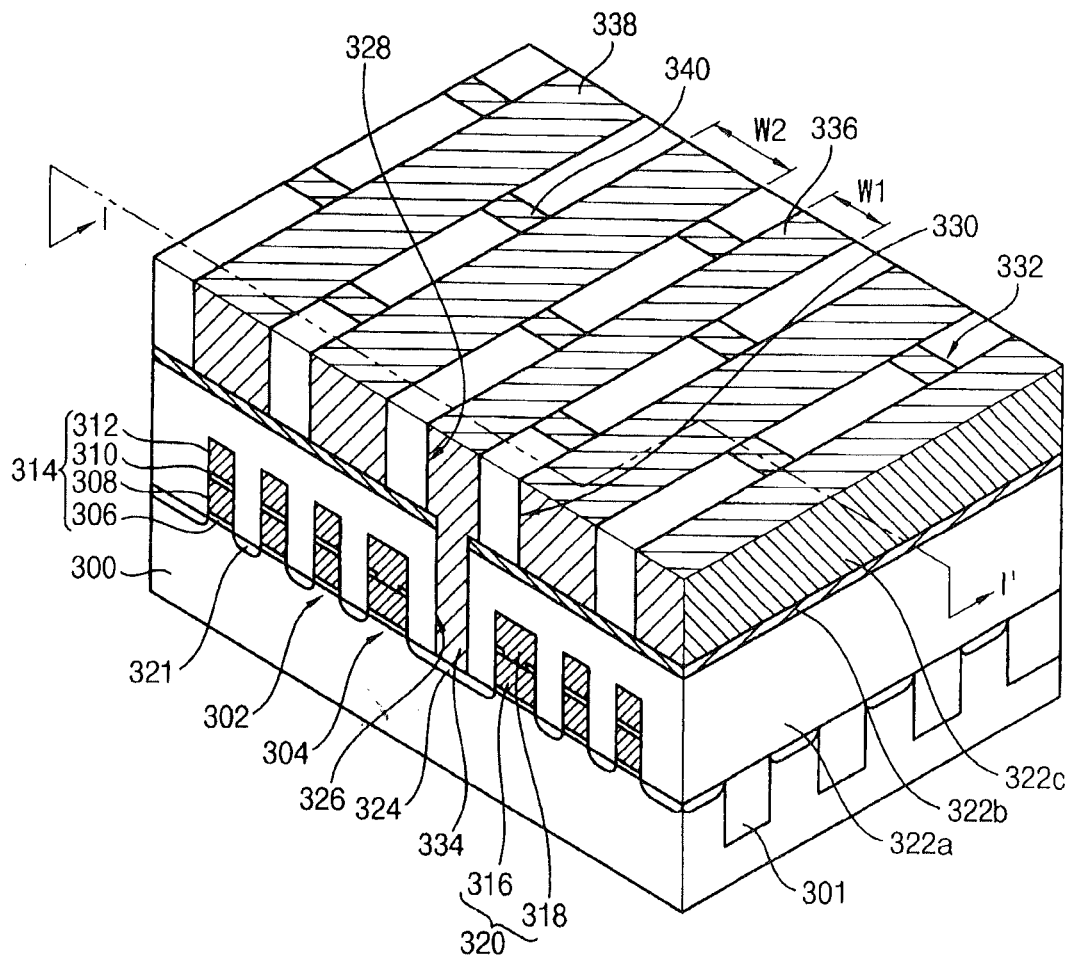
Figure 21:
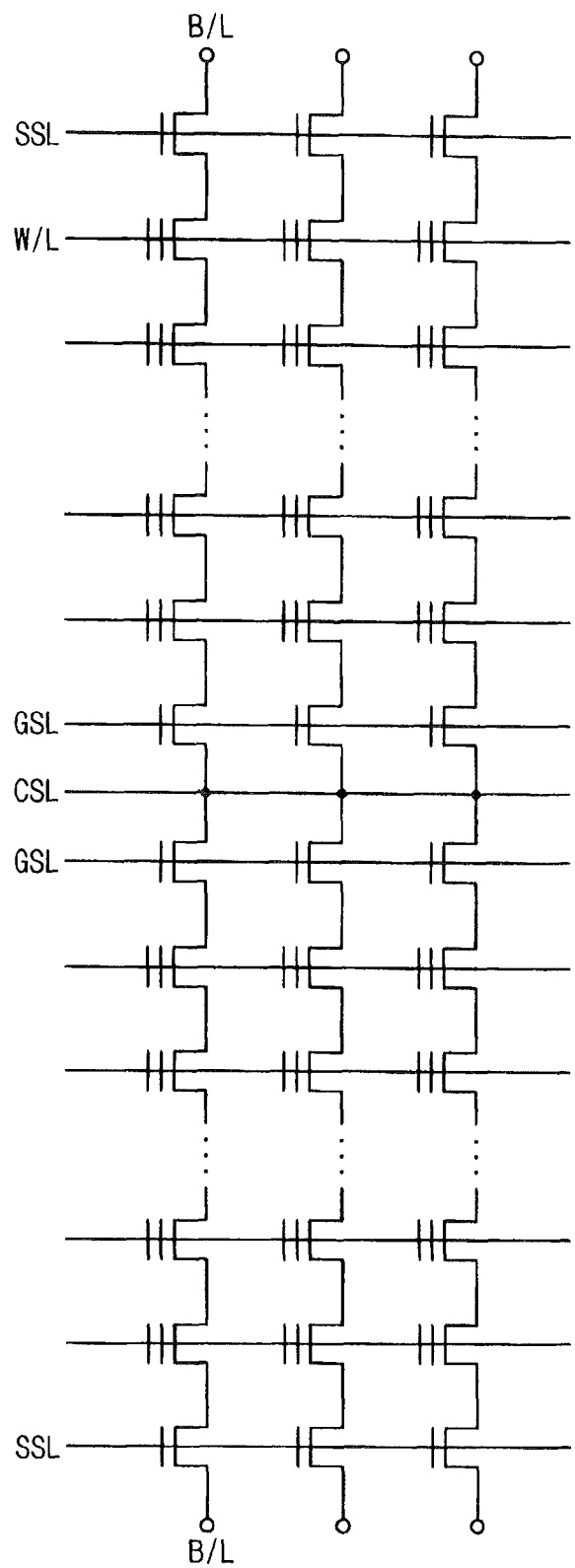

FIG. 20 is a NAND flash memory device in accordance with a sixth example embodiment. FIG. 21 is a circuit diagram of a NAND flash memory device in FIG. 20.

Referring to FIG. 20, a common source line and contact plugs in the NAND flash memory device may have the same constitution as the conductive pattern structure as illustrated in FIGS. 13 & 14.

Referring to FIGS. 20 and 21, transistors may be formed as a memory cell string unit in a cell region of the NAND flash memory device as shown in FIG. 21. The cell string may include 16 or 32 cell transistors 302 connected in series. At both sides of the cell transistors 302, cell selecting transistors (SSL) and ground selecting transistors (GSL) 304 may be serially connected, respectively. Impurity doped regions of the ground selecting transistors 304 may be common source regions 324. A common source line CSL may be connected with the common source regions 324.

The common source line CSL may have a linear shape extending along the first direction, which may be a direction of the word lines of the cell transistors 302. The common source line CSL may be used in common with neighboring cell strings to a second direction perpendicular to the first direction.

The NAND flash memory device formed on the substrate will be described hereinafter.

An active region having a linear shape extending along the second direction may be formed at the surface portion of the substrate 300. Cell transistors 302, cell selecting transistors and ground selecting transistors 304 may be formed on the substrate 300.

The cell transistors 302 may include a first gate structure 314 including laminated patterns of a tunnel oxide layer pattern 306, a charge storing layer pattern 308, a dielectric layer pattern 310 and a control gate pattern 312.

The cell selecting transistors and the ground selecting transistors 304 may include a laminated structure of a second gate structure 320 including a gate oxide layer pattern 316 and a gate electrode 318.

Impurity regions may be formed at the surface portions of the substrate at both sides of the first and the second gate structures 314 and 320. The impurity regions at the end portion of the ground selecting transistors 304 may be the common source regions 324.

A first insulating interlayer 322a covering the cell transistors 302 and the selecting transistors 304 may be formed. An etch stop layer 322b may be formed on the first insulating interlayer 322a. The first insulating interlayer 322a may be formed by using silicon oxide and the etch stop layer 322b may be formed by using silicon nitride.

Through the first insulating interlayer 322a and the etch stop layer 322b, contact holes 326 exposing the common source regions 324 of the substrate 300 may be formed. In the contact holes 326, contact plugs 334 may be disposed. The contact plugs 334 may contact the common source regions 324 in the cell strings disposed along the first direction. Accordingly, the contact plugs 334 may be aligned along the first direction in parallel to each other.

On the etch stop layer 322b, a second insulating interlayer 322c may be formed. First, second and third trenches 328, 330 and 332 may be included in the second insulating interlayer 322c.

Particularly, the first trench 328 may expose the contact plugs 334 and have a shape extending along the first direction. The first trench 328 may have a first width W1.

Second trenches 330 that are adjacent to the first trench 328 and have a linear shape extending along the first direction may be formed. The second trenches 330 may have a second width W2, which may be the same as or larger than the first width W1.

The third trenches 332 penetrating the side walls of the second insulating interlayer 322c protruding between the first and the second trenches 328 and 330 may be formed.

The first minute conductive line 336 and the second minute conductive lines 338 may be formed in the first and the second trenches 328 and 330. Connecting lines 340 may be formed in the third trenches 332.

The first and the second minute conductive lines 336 and 338, the connecting lines 340 and the contact plugs 334 may have the same structure as the conductive pattern structure referring to FIGS. 13 and 14. The first minute conductive line 336 may have a first line width W1 and the second minute conductive lines 338 may have a second line width W2, which may be the same as or larger than the first line width W1. The second line width W2 may be smaller than twice of a height of the second minute conductive lines 338. The second line width W2 may be smaller than about 3500 Å.

The contact plugs 334, the first and the second minute conductive lines 336 and 338 and the connecting lines 340 may be formed by using the same metal material. The metal material may include tungsten. Alternatively, the metal material may include copper or aluminum.

The first and the second minute conductive lines 336 and 338 and the connecting lines 340 may be electrically connected and function as a common source line. The common source line may be connected to the common source regions through the contact plugs 334.

Figure 22:
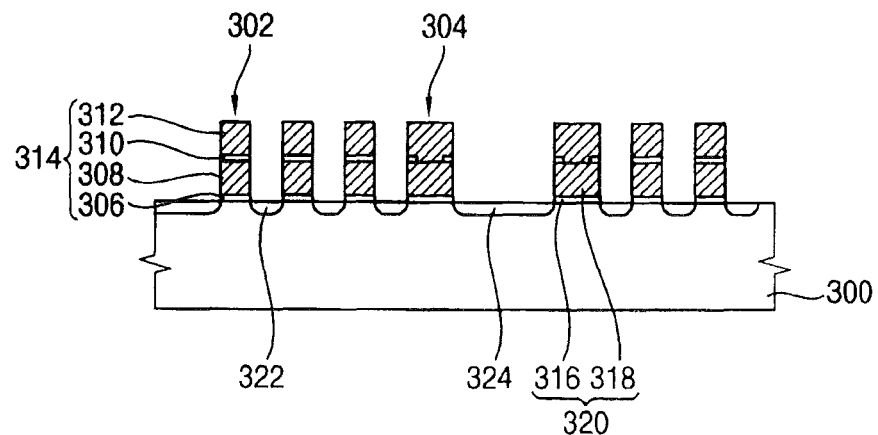
Figure 23:
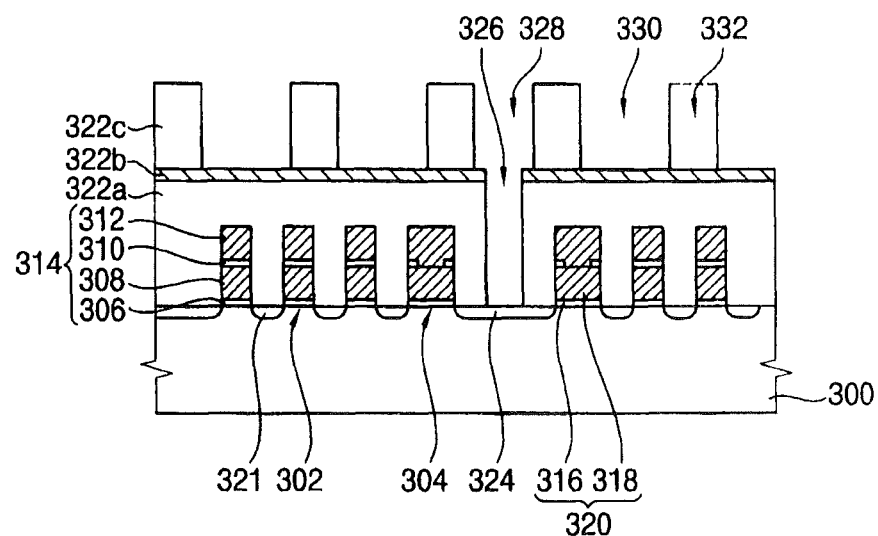
Figure 24:
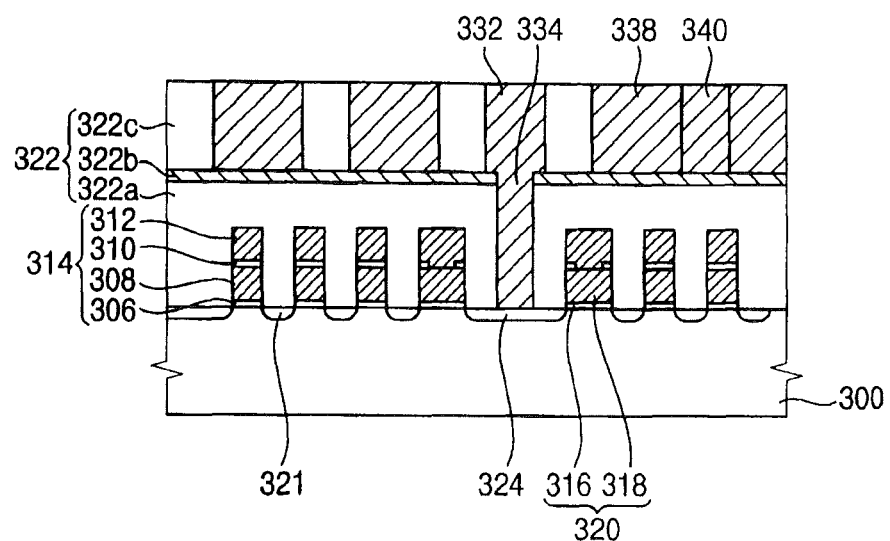

FIGS. 22 to 24 are cross-sectional views illustrated for explaining a method of manufacturing the NAND flash memory device in FIG. 20.

The cross-sections of FIGS. 22 to 24 may be taken along a line I-I' in FIG. 20.

Referring to FIG. 22, the substrate 300 of a semiconductor material may be provided. The substrate 300 may include single crystalline silicon. An isolation process may be implemented to form isolation patterns 301 in FIG. 20. The cell transistors 302 and the selecting transistors 304 may be formed on the substrate 300. The manufacturing process of the cell transistors 302 and the selecting transistors 304 will be described briefly.

The surface portion of the substrate 300 may be oxidized to form a tunnel oxide layer and a gate oxide layer, respectively. A preliminary charge storing layer pattern may be formed on the tunnel oxide layer and the gate oxide layer. The preliminary charge storing layer pattern may be formed by using polysilicon. Alternatively, the preliminary charge storing layer pattern may be formed using silicon nitride that may trap charges. A dielectric layer may be formed on the preliminary charge storing layer. A portion of the dielectric layer, where the selecting transistors 304 may be to be formed, may be removed. A conductive layer may be formed on the dielectric layer. The conductive layer, the dielectric layer, the preliminary charge storing layer and the tunnel oxide layer may be patterned subsequently.

The first gate structure 314 may be obtained, which has a stacked structure having the tunnel oxide layer pattern 306, the charge storing layer pattern 308, the dielectric layer pattern 310 and the control gate pattern 312. While performing the process for forming the conductive layer and the patterning process, the second gate structure 320 including an stacked structure of a gate oxide layer pattern 316 and a gate electrode 318 may be formed at the portion where the selecting transistors 304 is to be formed. Impurities may be doped into the substrate and both sides of the first and the second gate structures 318 and 320, and impurity doped regions 321 may be formed at both sides of the first gate structure 318. In this case, the impurity doped regions 321 at an end portion of the ground selecting transistors may be the common source regions 324.

Referring to FIG. 23, the first insulating interlayer 322a covering the cell transistors 302 and the selecting transistors 304 may be formed on the substrate 300. The etch stop layer 322b may be formed on the first insulating interlayer 322a. The second insulating interlayer 322c may be formed on the etch stop layer 322b.

Portions of the second insulating interlayer 322c, the etch stop layer 322b and the first insulating interlayer 322a may subsequently etched to form contact holes 326 exposing the common source regions 324.

A portion of the second insulating interlayer 322c may be etched to form at least one of the first trench 328 having a linear shape making contact with and connected to the upper portion of the contact holes 326 and having a first width W1, and the second trenches 330 being adjacent to the first trench 328 and having a second width W2, which may be the same as or larger than the first width W1. The third trenches 332 penetrating the side walls of protruding portions of the layer 322c between the first and the second trenches 328 and 330 may be formed.

The procedure for forming the contact holes 326 and the procedure for forming the first, the second and the third trenches 328, 330 and 332 may be exchanged or performed in a different sequence. For example, the first, the second and the third trenches 328, 330, 332 may be formed before forming the contact holes 326 in the first trench 328.

Referring to FIG. 24, a conductive layer may be formed to fill up the first, the second and the third trenches 328, 330 and 332 and the contact holes 326. The conductive layer may include a metal.

The conductive layer may be deposited to a thickness smaller than the desired or critical deposition thickness. Through depositing the conductive layer to the thickness, the inner portions of the first, the second and the third trenches 328, 330 and 332 and the contact holes 326 may be filled. The desired or critical deposition thickness may be smaller than about 2,500 Å.

The conductive layer deposited on the upper surface of the second insulating interlayer 322c may be polished to form the first minute conductive line 336, the second minute conductive lines 338, the contact plugs 334 and the connecting lines 340. The first and the second conductive lines 336 and 338 and the connecting lines 340 may electrically function as one conductive line. The contact plugs 334 may be electrically connected with the first and the second minute conductive lines 336 and 338 and the connecting lines 340.

The common source line including the first and the second minute conductive lines 336 and 338 and the connecting lines 340 may be obtained through performing the polishing process. The common source line may be electrically connected to the common source regions through the contact plugs 334.

Figure 25:
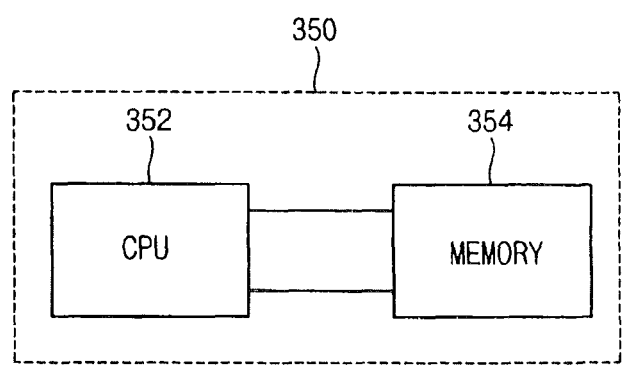

FIG. 25 is a block diagram illustrating a system including a NAND flash memory device in FIG. 20.

Referring to FIG. 25, a system 350 may include a central processing unit (CPU) 352 and a memory 354. The memory 354 may include the NAND flash memory in accordance with example embodiments. The memory 354 may be connected with the CPU directly or through a BUS.

The conductive pattern structure in accordance with example embodiments may be applicable to a semiconductor device including a wiring and particularly, to a semiconductor device including a wiring having a low resistance.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A conductive structure, comprising:
   a contact plug extending through an insulating layer to contact a region of a substrate;
   first and second conductive lines extending substantially parallel to one another on the insulating layer, wherein the first conductive line extends on the contact plug, and wherein a width of the second conductive line is less than twice a height of the second conductive line; and
   a connecting line on the insulating layer extending between and electrically connecting the first and second conductive lines such that the first and second conductive lines collectively define a single conductive line, wherein the second conductive line is free of electrical connection to the region of the substrate other than through the first conductive line.

2. The conductive structure of claim 1, wherein the first and second conductive lines extend in a first direction substantially parallel to one another, wherein the connecting line extends in a second direction substantially perpendicular to the first direction.

3. The conductive structure of claim 1, wherein the insulating layer comprises a mold pattern, the mold pattern comprising:
   first and second trenches extending in a first direction substantially parallel to one another and including the first and second conductive lines therein, respectively; and
   a third trench extending in a second direction and including the connecting line therein, wherein the third trench extends through portions of the mold pattern protruding between the first and second trenches.

4. The conductive structure of claim 3, wherein a width of the second trench is less than twice a depth of the second trench.

5. The conductive structure of claim 4, wherein the depth of the second trench is less than about 2500 angstroms.

6. The conductive structure of claim 1, wherein the width of the second conductive line is less than about 3500 angstroms.

7. The conductive structure of claim 1, wherein the width of the second conductive line is greater than or equal to a width of the first conductive line, and wherein a width of the connecting line is less than or equal to the width of the second conductive line.

8. The conductive structure of claim 7, wherein the connecting line comprises a first connecting line, and further comprising:
   a second connecting line on the insulating layer extending between the first and second conductive lines.

9. The conductive structure of claim 8, wherein the first and second connecting lines extend substantially parallel to one another, and wherein the second connecting line includes a defect therein such that the first and second conductive lines are not electrically connected thereby.

10. The conductive structure of claim 9, further comprising:
    a third conductive line extending substantially parallel to the first conductive line on the insulating layer.

11. The conductive structure of claim 10, further comprising:
    a third connecting line on the insulating layer extending between and electrically connecting the first and third conductive lines.

12. The conductive structure of claim 1, wherein the first and second conductive lines and the connecting line comprise a same metal layer.

13. The conductive structure of claim 12, wherein the metal layer comprises tungsten.

14. The conductive structure of claim 1, further comprising:
    a plurality of serially connected transistors on the substrate,
    wherein the contact plug extends through the insulating layer to the substrate to electrically connect the first conductive line with a source/drain region of one of the plurality of serially connected transistors.

15. An integrated circuit device, comprising:
    a plurality of transistors on a substrate;
    an insulating layer on the plurality of transistors;
    a contact plug extending through the insulating layer to contact a source/drain region of one of the plurality of transistors;
    a plurality of conductive lines extending substantially parallel to one another on the insulating layer, wherein a width of one of the plurality of conductive lines is less than twice a height of the one of the plurality of conductive lines, and wherein one of the plurality of conductive lines extends on the contact plug; and
    a connecting line on the insulating layer extending between and electrically connecting the one of the plurality of conductive lines to another of the plurality of conductive lines adjacent thereto, wherein the another of the plurality of conductive lines is free of electrical connection to the source/drain region other than through the one of the plurality of conductive lines.

16. The device of claim 15, further comprising:
    a plurality of connecting lines extending on the insulating layer and electrically connecting adjacent ones of the plurality of conductive lines to one another,
    wherein the connecting line comprises one of the plurality of connecting lines.

17. The device of claim 15, wherein the plurality of conductive lines extend in a first direction substantially parallel to one another, and wherein the plurality of connecting lines extend in a second direction substantially perpendicular to the first direction.

18. The device of claim 15, wherein the insulating layer comprises a mold pattern, the mold pattern comprising:
   a plurality of first trenches extending in a first direction substantially parallel to one another and including the plurality of conductive lines therein, respectively; and
   a plurality of second trenches extending in a second direction and including the plurality of connecting lines therein, respectively,
   wherein the plurality of second trenches extend through portions of the mold pattern protruding between the plurality of first trenches.

19. The device of claim 15, wherein the width of the one of the plurality of conductive lines is less than about 3500 angstroms.

20. The device of claim 15, wherein the plurality of transistors comprise a plurality of serially connected memory cell transistors of a NAND flash memory device, and wherein the one of the plurality of conductive lines, the another of the plurality of conductive lines adjacent thereto, and the connecting line define a common source line of the NAND flash memory device.

21. The conductive structure of claim 2, further comprising: an additional connecting line extending on the insulating layer and electrically connecting the first and second conductive lines.

22. A conductive structure, comprising:
   a contact plug extending through an insulating layer to contact a region of a substrate;
   a plurality of conductive lines extending substantially parallel to one another on the insulating layer, wherein one of the plurality of conductive lines extends on the contact plug, wherein the plurality of conductive lines have respective widths that are less than twice respective heights thereof, and wherein the width of at least one other of the plurality of conductive lines is greater than the width of the one of the plurality of conductive lines extending on the contact plug; and
   a plurality of connecting lines on the insulating layer and extending between adjacent ones of the plurality of conductive lines to collectively define a single conductive line providing an electrical connection to the contact plug, wherein the connecting lines have respective widths that are narrower than the respective widths of the conductive lines, and wherein at least one of the connecting lines includes a defect therein such that one of the plurality of conductive lines adjacent thereto is not electrically connected thereby,
   wherein the at least one other of the plurality of conductive lines is free of electrical connection to the region of the substrate other than through the one of the plurality of conductive lines extending on the contact plug.

* * * * *